United States Patent [19]

Scifres et al.

[11] Patent Number: 4,675,709
[45] Date of Patent: Jun. 23, 1987

[54] QUANTIZED LAYERED STRUCTURES WITH ADJUSTED INDIRECT BANDGAP TRANSITIONS

[75] Inventors: Donald R. Scifres, Los Altos; Robert D. Burnham, Palo Alto, both of Calif.

[73] Assignee: Xerox Corporation, Stamford, Conn.

[21] Appl. No.: 820,600

[22] Filed: Jan. 21, 1986.

Related U.S. Application Data

[63] Continuation of Ser. No. 390,422, Jun. 21, 1982, abandoned.

[51] Int. Cl.$^4$ ............... H01L 29/14; H01L 29/205; H01L 29/207; H01L 33/00
[52] U.S. Cl. ............................... 357/17; 357/4; 357/16; 357/63; 357/64; 148/DIG. 160; 148/DIG. 23; 148/DIG. 40; 148/DIG. 72; 148/DIG. 119
[58] Field of Search ............... 357/4, 16, 17, 63, 64

[56] References Cited

U.S. PATENT DOCUMENTS

| | | | |
|---|---|---|---|
| 3,309,553 | 3/1967 | Kroemer | 357/16 |
| 3,626,257 | 12/1971 | Esaki et al. | 357/4 |
| 3,872,400 | 3/1975 | Glausecker et al. | 357/16 |
| 3,982,207 | 9/1976 | Dingle et al. | 357/16 |
| 4,101,920 | 7/1978 | Nagasawa et al. | 357/63 |
| 4,154,630 | 5/1979 | Diguet et al. | 357/63 |
| 4,208,667 | 6/1980 | Chang et al. | 357/4 |
| 4,252,576 | 2/1981 | Hasegawa et al. | 357/63 |
| 4,261,771 | 4/1981 | Dingle et al. | 357/16 |
| 4,365,260 | 12/1982 | Holonyak, Jr. | 357/17 |
| 4,439,782 | 3/1984 | Holonyak, Jr. | 357/4 |

OTHER PUBLICATIONS

A. T. Vink, "The Dependence of the Radiative Transition Probability of Donor-Acceptor Pairs on Pair Separation", Journal of Luminescence, pp. 159-179 (1974).
"Phonon Contribution to Metalorganic Chemical Vapor Deposited $Al_xGa_{1-x}As$-GaAs Quantum-Well Heterostructure Laser Operation"-B. A. Vojak et al—Journal of Applied Physics, vol. 52(2), pp. 959-968 (2/81).

Primary Examiner—William D. Larkins
Attorney, Agent, or Firm—W. Douglas Carothers, Jr.

[57] ABSTRACT

A semiconductor quantized layered structure comprising first and second different semiconductor materials comprising compound semiconductors from both the Group III and Group V elements and forming a plurality of alternate layers, each interfaced to its adjacent layer in a semiconductor homojunction or heterojunction. The bottom of the conduction bands of the first and second materials are at different energy levels and the tops of the valence bands of the first and second materials are at different energy levels. The bottoms of the conduction bands of the first and second materials form a plurality of serially arranged potential wells and barriers due to differences in the band structures of the different materials forming alternate layers and the interfacing of the layers forming heterojunctions so that the thinness of the layers will spatially localize electrons to obtain quantized electron states in one dimension transverse to the longitudinal extent of said layers. The invention is characterized in that the first material is an indirect bandgap material and optimized luminescence efficiency of the first material is achieved by adjusting the thickness of the layers comprising the first material to be less than the mean free path of an electron in the first material in the absence of the second material. Three dimensional quantized electron states may be provided in certain layers of the quantized layered structure with the incorporation of an impurity, such as, a donor or acceptor impurity or an isoelectronic impurity forming isoelectronic centers (IEC) in the indirect bandgap semiconductor material. Such an incorporation may be in each layer of the first and second materials or only in the alternate layers of the lower indirect bandgap material. Alternatively, the impurity may be in a predetermined periodic alternate of layers of the same indirect bandgap material, e.g., in one layer out of three, in alternate layers of a plurality of layers or in every $n^{th}$ layer or every $n^{th}$ group of layers where n may be any integer.

39 Claims, 9 Drawing Figures

QUANTIZED LAYERED STRUCTURES WITH ADJUSTED INDIRECT BANDGAP TRANSITIONS

This is a continuation, of application Ser. No. 390,422, filed June 21, 1982, now abandoned.

BACKGROUND OF THE INVENTION

This invention relates to semiconductor quantized layered structures, particularly as applied to luminescent devices, such as semiconductor injection lasers and light emitting diodes.

In recent years, interest has intensified to the employment of quantum-mechanical effects in electrical properties provided in superlattice and other quantized layered structures formed by a periodic variation of alloy composition and/or doping impurity with a period less than the electron mean free path. The interest in this subject has been much enhanced, in part, by the development of molecular beam epitaxy (MBE), metalorganic chemical vapor deposition (MO-CVD) and automated liquid phase epitaxy (LPE). In these processes, very thin uniform layers of alloy composition comprising elements in Group III and Group V can be readily deposited so as to form one or more layers that alternate in bandgap properties and form at their interfaces a semiconductor heterojunction. The layer or alternating layers of a first material has or have an alloy composition that provides a direct, narrow bandgap and, therefore, efficient light emitting capability, compared to the alternating layers of a second material having an alloy composition that provides a wider bandgap than that of the first material. Many times, this wider bandgap material has an indirect band structure. As a result, the conduction bands of the second material have different energy levels so that the indirect band is at a lower energy level compared to the direct band whereas the conduction bands of the first material have different energy levels so that the direct band is at a lower level compared to the indirect band. The direct bandgap property of the first material permits the relatively easy attainment of carrier recombination and emission of photons which, combined with further stimulation, can produce lasing conditions.

Conversely, the indirect bandgap structure of the second material does not provide for efficient radiative recombination since the recombination of an electron and hole involves the simultaneous emission of both a photon and a phonon which is very improbable. In a quantized layered structure, the layer or layers of the first material being thinner then the electron mean free path, form a one-dimensional periodic potential medium comprising a plurality of potential wells in the first material and barriers formed by the second layers. These wells and barriers quantize and trap electrons, leading to an increase in the energy emitted by each photon in the direct bandgap first material. Background in this subject may be found in U.S. Pat. No. 4,261,771 and the references cited in this patent.

Recently studies have been conducted to determine the nature of phonon contribution in heterostructure laser operation relative to both direct and indirect gap levels. One example is the article of B. A. Vojak, N. Holonyak, Jr., W. D. Laidig, K. Hess, J. J. Coleman and P. D. Dapkus entitled "Phonon Contribution to Metal-organic Chemical Vapor Deposited $Al_xGa_{1-x}AsGaAs$ Quantum-Well Heterostructure Laser Operation", *Journal of Applied Physics*, Vol. 52(2), pp 959-968, February, 1981. By understanding phonon contributions, it may be possible to improve the luminescence efficiency of light emitting materials having major indirect bands, i.e., a conduction band minimum that lie at a different position in momentum space (k-space) than does the valence band maximum.

The suggestion has been made that the luminescence efficiency could be improved in alloy compositions in the Group III–V elements having a lower energy level indirect bandgap compared to the direct bandgap by shifting the indirect bandgap to be a direct bandgap material. See U.S. Pat. No. 3,872,400. This direct bandgap transition is said to be created by alternating layers of different alloy or nonalloy compositions.

As a more viable alternative, direct bandgap type of transition for indirect bandgap semiconductor materials may be achieved by quantum wells and barriers in layers of indirect bandgap materials to quantize electron states rather than shift the indirect bandgap to the point of zero momentum space to improve luminescence efficiency. Also, the incorporation of isoelectronic centers in indirect bandgap semiconductor materials forming quantum well layers provides for a three dimensional potential structure for quantizing electron states.

SUMMARY OF THE INVENTION

According to this invention, a semiconductor quantized layered structure comprising first and second different semiconductor materials comprising alloy compositions from both the the Group III and Group V elements or Group IV elements form a plurality of alternate layers, each interfaced to its adjacent layers in a semiconductor heterojunction. The bottoms of the conduction bands of these materials and the tops of the valence bands of these materials are such that they form a plurality of serially arranged potential wells and barriers due to differences in the band structures so that the thinness of said layers will quantize electron states in a direction transverse to the longitudinal extent of the layers. The invention is characterized in that the first material is an indirect bandgap material and wherein the first indirect bandgap material has optimized luminescence efficiency achieved by adjusting the thickness of the layers comprising the first material to be less than the mean free path of an electron in the first material absent the second material.

In the case where the first III-V material is an alloy composition, the optimized luminescent efficiency may be further enhanced by adjusting the compositional alloy to be near its direct/indirect transition.

This implementation of a one dimensional quantized electron state in the indirect gap material results in having improved probability that electrons will be in a direct gap transition for carrier recombination.

Further, according to this invention, three dimensional quantized electron states are provided in certain layers of the structure with the incorporation of an impurty, such as, a donor or acceptor impurity or an isoelectronic impurity forming isoelectric centers (IEC) in the indirect bandgap semiconductor material. Such an incorporation may be in each layer of the first and second materials or only in the alternate layers of the lower indirect bandgap material. Alternatively, the impurity may be in a predetermined periodic alternate of layers of the same indirect bandgap material, e.g., in one layer out of three, in alternate layers of a plurality of layers or in every $n^{th}$ layer or every $n^{th}$ group of layers, where n may be any integer.

DETAILED DISCUSSION OF PREFERRED EMBODIMENTS

Figure 1A:
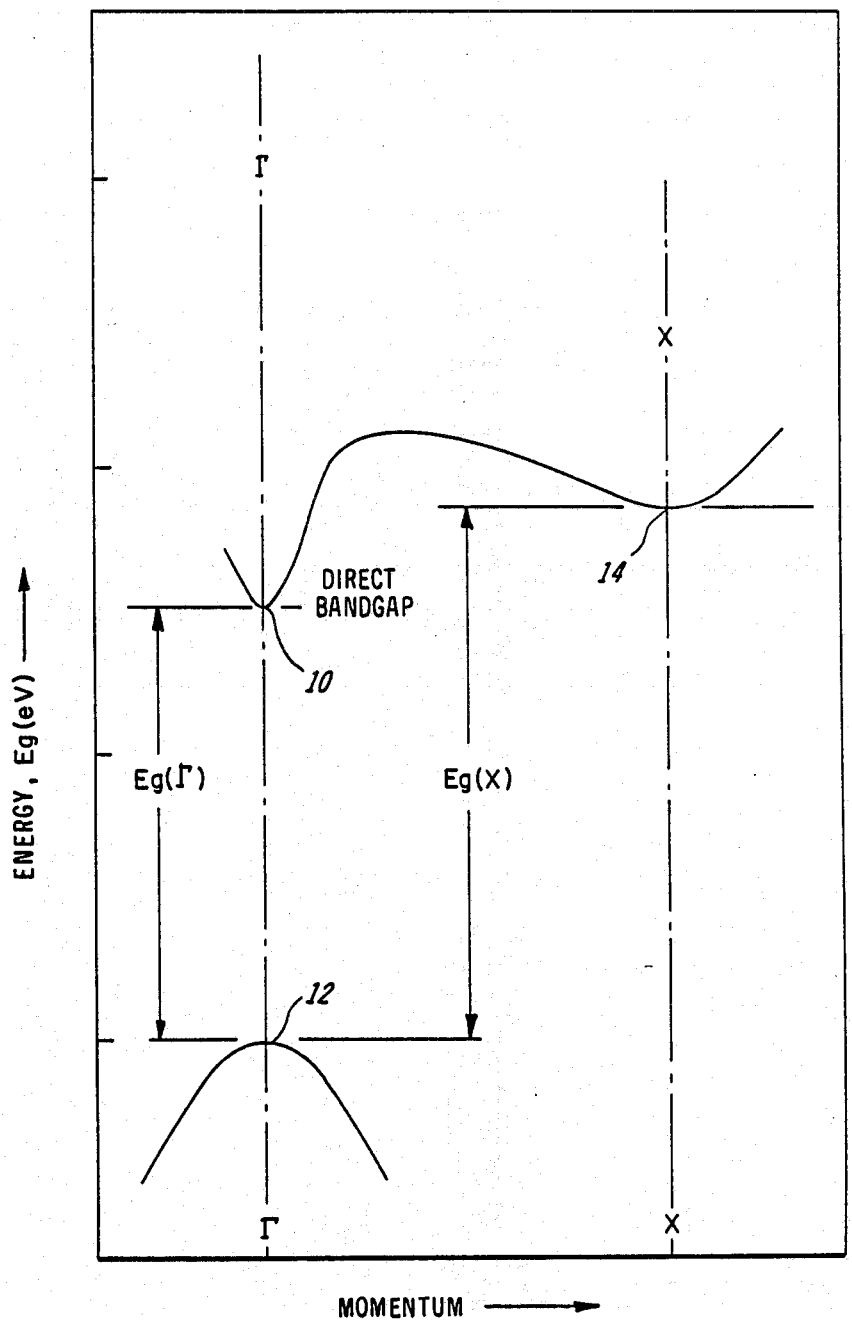
FIG. 1A is a graphical representation of the conduction and valence bands of a direct bandgap material and an indirect bandgap material, typical for Group III-V compounds.

In FIG. 1A, a conventional representation is disclosed for typical direct bandgap materials for Group III-V compounds. For direct bandgap materials, the absolute or bottom $\Gamma$ minima 10 of the conduction band lies at lowest energy level closest to the absolute or top of the $\Gamma$ maxima 12 of the valence band. This is the region where momentum in momentum or k space is equal to zero so that radiative recombination is a first order process involving the emission of a photon. On the other hand, the conduction band X minima 14 is at a higher energy state and at a region of greater momentum space. Thus, radiative recombination is an efficient process in a direct gap crystal.

Figure 1B:
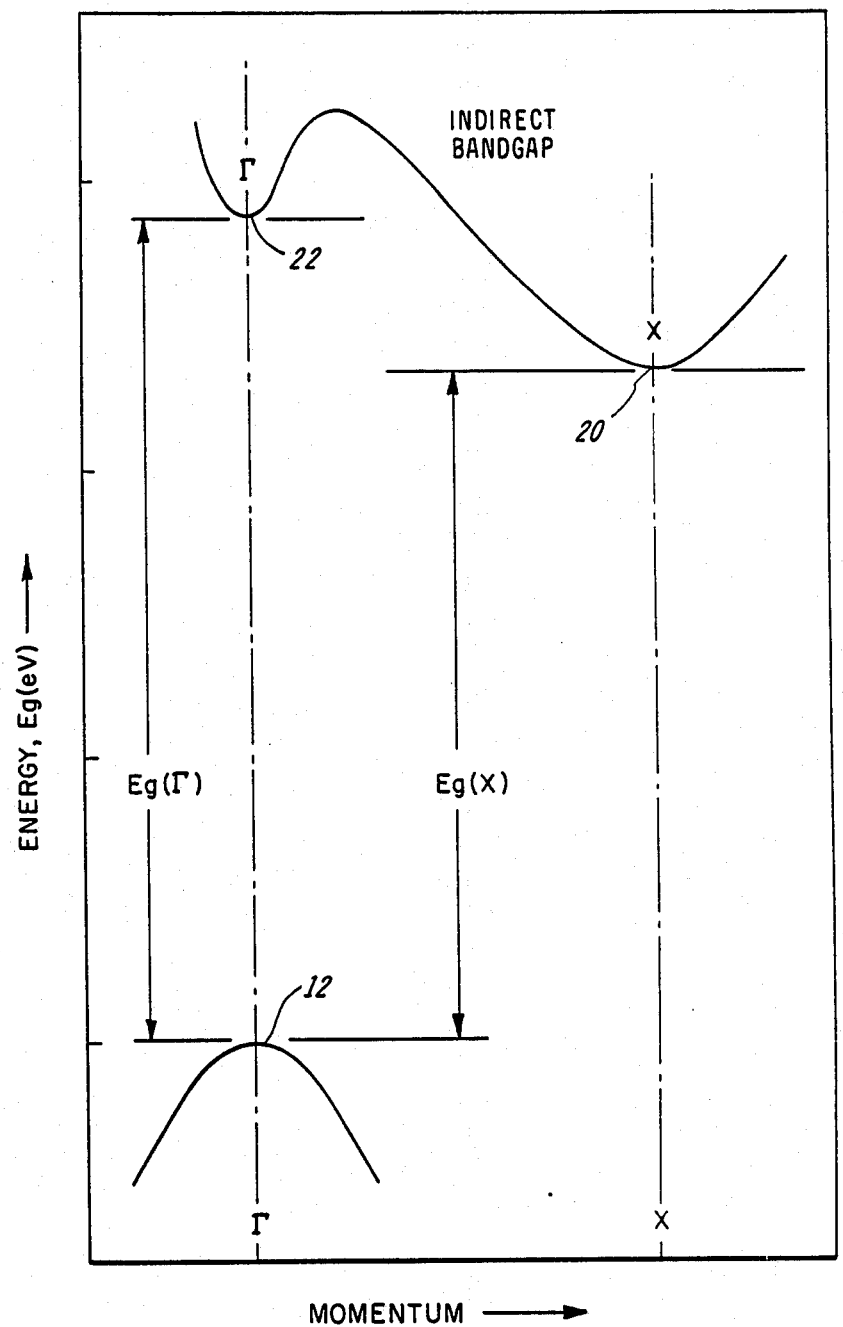
FIG. 1B is a graphical representation of the conduction and valence bands of an indirect bandgap material typical for Group III-V compounds.

In FIG. 1B, a conventional representation is disclosed for typical indirect bandgap materials for Group III-V compounds. In the case of indirect bandgap materials, the absolute or bottom minima of the conduction band at X minima 20 occurs at higher value in momentum space. The bottom $\Gamma$ minima 22 is at a higher energy level. If this minima is at an energy greater than about 4 kT, where T is temperature and k is Boltzmann's constant, then all the electrons lie in the lowest energy X minima and must undergo an "indirect" transition. The luminescent efficiency is, therefore, quite low.

The transition probability for intrinisic radiative recombination arises from the conversion of both crystal momentum and energy. In the case of indirect bandgap materials, this requires a second order process in which one or more phonons must be emitted simultaneously with a photon. The chances of radiative carrier recombination, occuring in indirect bandgap materials absent impurity induced luminescence, is practically nonexistent.

Figure 1C:
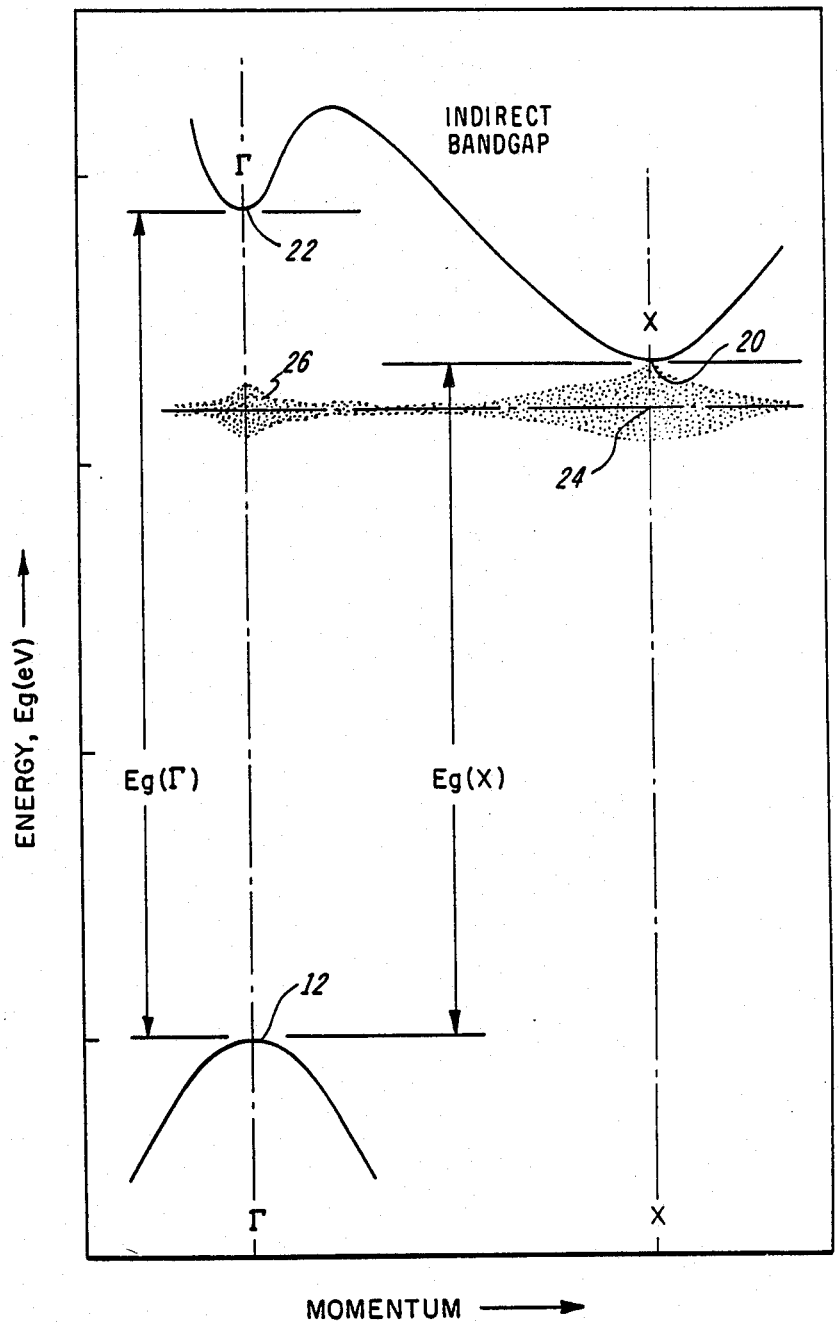
FIG. 1C is a graphical representation of the conduction and valence bands of an indirect bandgap material typical for Group III-V compounds with isoelectronic centers (IEC) formed by incorporation of an isoelectronic impurity.
Figure 1D:
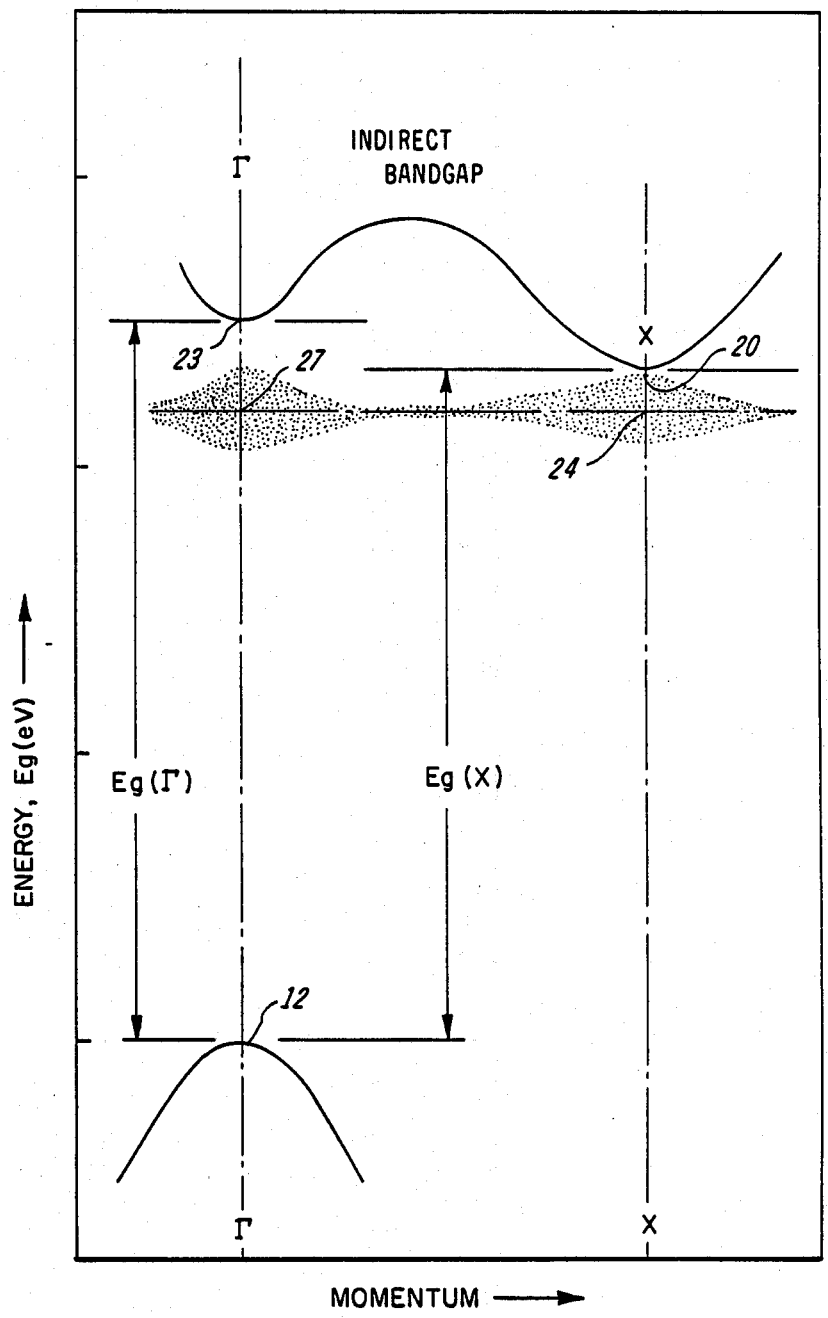
FIG. 1D is a graphical representation of the conduction and valence bands of an indirect bandgap material comprising a Group III-V alloy composition with isoelectronic center (IEC) formed by incorporation of an isoelectronic impurity.

It is well known that the incorporation of impurities such as isoelectronic impurities to indirect bandgap materials to create points that interact strongly with and trap (localize) free carriers, such as electrons, greatly enhances the probability of electron and hole radiative recombination. As an example, nitrogen (N) added to GaP forms an isoelectronic center which localizes (traps) the electron in real space (x,y,z). This leads to a spreading of the electron wave function in momentum space ($k_x$, $k_y$, $k_z$) in a manner analogous to the Uncertainty Principle. It can be shown by band structure calculations that the electron wave function spreads in momentum space. This is illustrated in FIG. 1C. This spread in momentum space is characterized by having a secondary momentum space maxima 26 beneath the $\Gamma$ conduction band minima although the primary momentum space maxima 24 still resides beneath the X conduction band minima. This means that by trapping (localizing) the electron, there is now an increased probability that the electron and hole can recombine in a "direct" manner without the emission of a phonon since the electron spends a portion of its time having a momentum equal to that of the hole in the valence band. When the $\Gamma$ and X conduction band minima move closer together in energy by changing alloy composition of the indirect bandgap material, as illustrated in FIG. 1D with the lower $\Gamma$ minima 23, the probability of this "direct" transition is thereby further enhanced. This is illustrated by the larger secondary momentum space maximum 27.

We have found that the radiative recombination efficiency can be significantly improved by employment of very thin layers of a wide indirect bandgap material alternated with one or more very thin layers of narrow indirect bandgap material. The layers are sufficiently thin to be less than the electron mean free path forming quantum wells and barriers. The barrier layers of indirect bandgap material must have sufficiently high bandgap relative to the layers of indirect bandgap material forming the wells so that electrons are spatially trapped in the formed wells. This indirect quantum well arrangement may be combined with adjustment of the compositional alloy comprising narrower bandgap material so that it is near its bulk direct/indirect transition, i.e., the positions of the direct ($\Gamma$) conduction band minima 22 and the indirect (X) conduction band minima 20 are designed to be substantially at the same energy level by adjusting the substitutional element component or components of the indirect bandgap alloy composition. In this manner, the energy level of both conduction bands can be adjusted to be substantially the same.

This configuration leads to an improved radiative recombination efficiency over indirect bandgap semiconductors of the same alloy composition.

The quantized layered structures in FIGS. 2-6 represent specific examples of III-V compounds for purposes of illustration, as other group III-V compounds may be employed. Also the periodic alternation of first and second materials of isoelectronic impurity incorporated layers need not necessarily be every alternate layer. For example, the periodic alternation could be every 2 or more layers dependent, for example, upon desired layer thicknesses.

Figure 2:
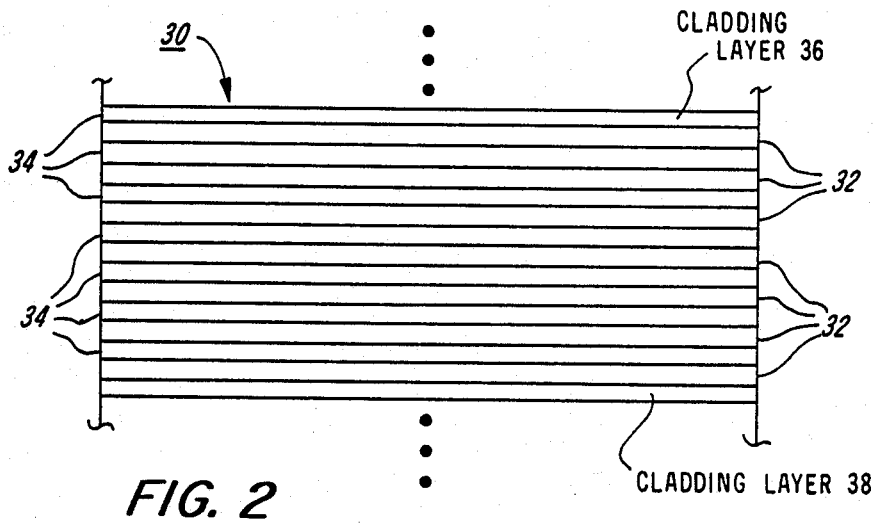
FIG. 2 is schematic representation of a heterojunction quantized layered structure comprising alternating thin layers of first and second indirect bandgap materials.

In FIG. 2, the heterojunction quantized layered structure 30 comprises thin layers 32 of GaP alternated with a plurality of thin layers 34 of GaAlP. The thickness of each of the layers 32 and 34 may, for example, be from about 5 Å to a maximum substantially the same as the electron mean free path, which may be as much as 50 Å to 500 Å in thickness depending on the crystal structure. The thickness range of 5 Å to 100 Å is believed preferred for most III-V compounds. The group of layers 32 and 34 are bounded by cladding layers 36 and 38, such as n and p type GaAlP, respectively. The vertical dotted representations in the figures represent any additional semiconductor layers commonly found in these semiconductor structures, particularly heterostructure lasers, such as cladding layers, light guiding layers, contact layers or semiconductor substrate. These structures may be conventionally fabricated by either MBE, MO-CVD or LPE.

The wider indirect bandgap material, GaAlP, will act to confine electrons to the thin indirect bandgap material GaP layer thereby spreading the electron wavefunction in momentum space, i.e., providing a large range of momentum value so that the time probability at zero momentum is increased thereby increasing the chances of electron-hole or radiative recombination. Said another way, the thin quantum well layers 32 and 34 tend to localize the electrons to certain spatial regions within layers 32. If the materials involved are III-V alloy compositions, their proper bulk direct/indirect transition is adjusted by changing the ratio substutional group elements so that the conductive band minimas are substantially the same. The chances of radiative recombination are thereby even more enhanced, thereby improving the overall radiative recombination efficiency of these indirect bandgap materials.

Figure 3:
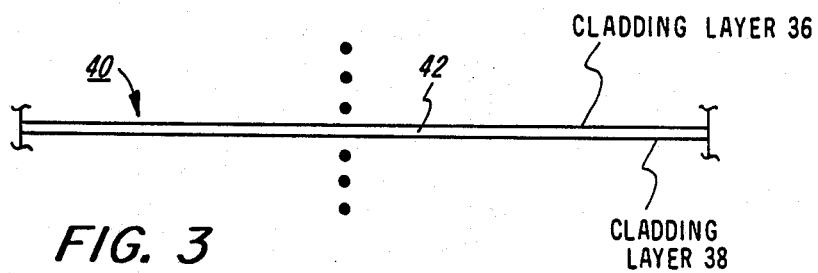
FIG. 3 is a schematic representation of a heterojunction quantized layered structure comprising a single thin layer of first indirect bandgap material sandwiched by layers of a second indirect bandgap material.

In FIG. 3, the heterojunction quantized layered structure 40 comprises a single layer 42 of GaP sandwiched by cladding layers 36 and 38 of GaAlP. Layer 42 is a single quantum well layer which may be, for example, about 5 Å to 50 Å thick.

Figure 4:
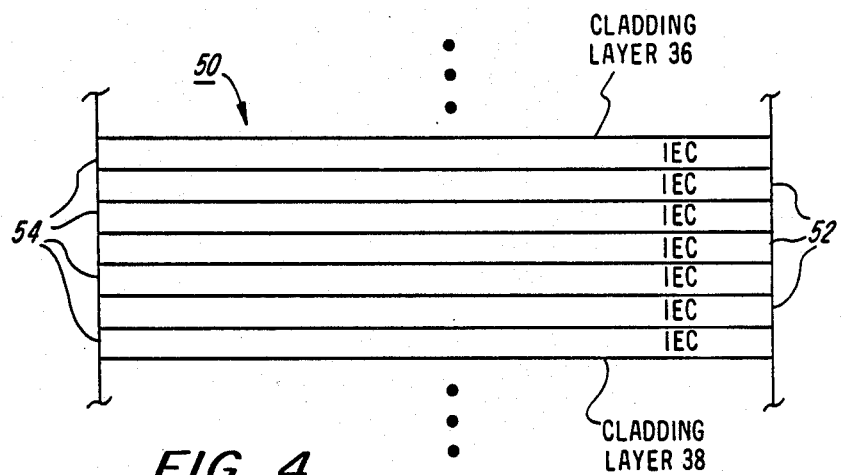
FIG. 4 is a schematic representation of a heterojunction quantized layered structure comprising alternating thin layers of first and second indirect bandgap materials being of lower bandgap with all layers doped with an isoelectronic impurity, to form isoelectronic centers (IEC).

In FIG. 4, the heterojunction quantized layered structure 50 comprises thin layers 52 of GaP alternated with thin layers 54 of GaAlP wherein all of these layers are doped with an isoelectronic impurity. e.g., GaP(N) and GaAlP(N). Alternatively, only the narrow gap GaP layers 52 may be doped with such an isoelectronic impurity. The addition of this impurity provides isoelectronic centers (IEC) that form electronic traps in the lattice structure. As a result, electron isolation is provided in three dimensions in the narrow indirect bandgap material, i.e., the combination quantum well effect and the isoelectronic centers (IEC) in these layers provides for improved localization of electronics in spatial regions of the lattic both transversely and longitudinally in all directions relative to the elongated extent of the layers, i.e., in all directions relative to spatial regions of the quantum wells and barriers formed by the thin layers. We have found that this leads to an even further enhancement of the "direct" phonon-less radiative recombination process in an indirect bandgap III-V compound semiconductor.

In the quantized layered structure 50, this localization has been increased several orders of magnitude due to the multidirectional effect of electron localization. Three factors are involved in the high probability for a direct radiative transition to occur in this indirect bandgap material. First, there is the quantum well and barrier effect due to the thinness of the layers 52 and 54 to localize electrons dimensionally in one spatial regime. Secondly, there can be the adjustment of the compositional alloy so that the light emitting material is near its bulk direct/indirect transition. Third, there is the incorporation of isoelectronic traps in at least one of the light emitting layer or layers to localize electrons dimensionally in the other spatial regime. While the first and third factors are predominant, the combination of all three may provide high radiative efficiency for more complex alloy compositions, e.g., modulation of the bandgap of quantum well thin layers such as GaAlAsP(N) or GaAsP(N) by changing the Al:Ga ratio in the crystal. For GaAlAs(N) this is about $Ga_{0.56}Al_{0.44}As$ or for GaAsP(N) this is about $GaAs_{0.57}P_{0.43}$.

Figure 5:
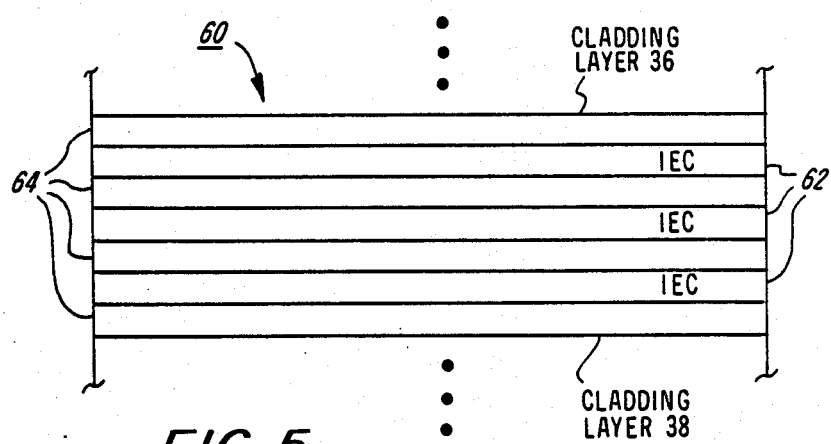
FIG. 5 is a schematic representation of a heterojunction quantized layered structure comprising alternating layers of first and second indirect bandgap materials, with layers of the first material being of lower bandgap and doped with an isoelectronic impurity, to form isoelectronic centers (IEC).

In FIG. 5, the heterojunction quantized layered structure 60 comprises multiple layers of an indirect bandgap first and second materials. Layers 62 comprise narrower indirect bandgap material such as GaP, and are doped with an isoelectronic impurity, e.g., nitrogen, forming isoelectronic centers (IEC) in these layers. Alternate layers 64 are not doped with such an impurity. Each of the layers 62 and 64 may be 5 Å to approximately 250 Å thick, although thinner layers are preferred. Layers 62 and 64 may be deposited in MO-CVD or other growth chamber. First, one layer 64 such as, GaP or GaAlP, is epitaxially grown followed by the introduction of nitrogen in growth of the next layer 62 using the alternate material.

Figure 6:
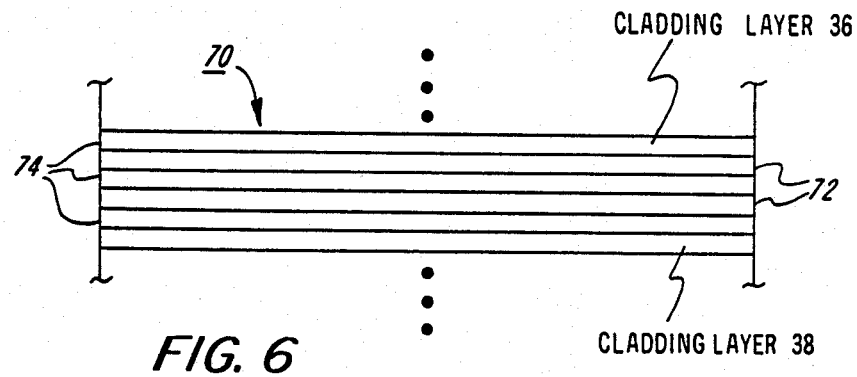
FIG. 6 is a schematic representation of a quantized layered structure comprising layers of the same indirect bandgap material with periodic alternating layers doped with an impurity to form electron or hole isolation centers with the remaining layers absent of such doping.

In FIG. 6, the quantized layered structure 70 comprises multiple layers 72 and 74 of an indirect bandgap material, such as, GaP, with a predetermined periodic alternate of those layers, designated as layers 72, doped with an impurity during the formation of these layers. The incorporated impurity spatially localizes electron or holes in layers 72, depending upon the type of impurity employed. The impurity may be a donor, acceptor or isoelectronic impurity. A donor impurity may be selected from the group consisting of Si, Se, Te, Sn, S or Ge. An acceptor impurity may be selected from the group consisting of Zn, Cd, Mg, Be, Si or Ge. An isoelectronic impurity may be nitrogen.

A periodic alternate for doped layers may be every other layer, as shown in FIG. 6 as to layers 72, or every $n^{th}$ layer (e.g., every third layer) or every $n^{th}$ group of layers, where n may be any integer.

The impurity may be supplied during structural growth by modulating the dopant supply on and off in the growth reactor to produce atomic layers 72 with impurity for localization of electrons or holes, depending upon the type of impurity employed, alternated with thin atomic layers 74 having no impurity. Each of these layers 72 and 74 may be, for example, approximately 5 Å to 50 Å thick.

In the case of donor or isoelectronic impurity centers, it may be preferable that layers 72 having such centers be about 10 Å thick while the undoped separating layers 74 are about 50 Å. In this way, the electron states will be well localized, i.e., electrons will not be apt to interact with transversely lattice spaced atom pairs, e.g., nitrogen pairs, so that localization to two isoelectric pairs rather than one is not so probable.

Binary compounds and compositional alloys from the Group III-V elements of Al, Ga, In, As, P and Sb are considered. Some examples are GaP; GaAlAs; GaAsP; InGaP; AlP; GaALAsP; InGaAsP or InGaAlAsP.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. A semiconductor quantized layered structure comprising first and second different semiconductor materials comprising compound semiconductors from both the Group III and Group V elements and forming a plurality of alternate layers, each interfaced to its adjacent layer in a semiconductor heterojunction, the bottom of the conduction bands of said first and second materials being at different energy levels and the tops of the valence bands of said first and second materials being at different energy levels, the bottoms of said conduction bands of said first and second materials forming a plurality of serially arranged potential wells and barriers due to differences in the band structures of said different materials forming said alternate layers and the interfacing of said layers in said heretojunctions so that the thinness of said layers will spatially localize electrons to obtain quantized electron states in one dimension transverse to the longitudinal extent of said layers, characterized in that said first material is an indirect bandgap material, said first material having optimized luminescence efficiency achieved by adjusting the thickness of said layers comprising said first material to be less than the mean free path of an electron in said first material in the absence of said second material, said first material is an alloy composition with the compositional alloy adjusted to be near its bulk direct-/indirect transition, the layer or layers of said first and second materials are doped with an isoelectronic impurity to form isoelectronic centers that quantize electron states in three dimensions whereby electrons are localized in all directions relative to spatial regions of said formed wells.

2. The semiconductor quantized layered structure of claim 1 wherein the layer or layers of said first material are doped with an isoelectronic impurity to form isoelectronic centers that quantize electron states in said first material in three dimensions whereby electrons are localized in all directions relative to spatial regions of said formed wells.

3. The semiconductor quantized layered structure of claim 1 wherein the layer or layers of said first and second materials are doped with an isoelectronic impurity to form isoelectronic centers that quantize electron states in three dimensions whereby electrons are localized in all directions relative to spatial regions of said formed wells.

4. The semiconductor quantized layered structure of claim 1 wherein the layer or layers of said first material are doped with an isoelectronic impurity to form isoelectronic centers that quantize electron states in three dimensions whereby electrons are localized in all directions relative to spatial regions of said formed wells.

5. The semiconductor quantized layered structure of any one of the claims 1 through 4 wherein said isoelectronic impurity is nitrogen.

6. The semiconductor quantized layered structure of any one of the claims 1 through 4 wherein the thickness of said first material layers is in the range of 5 Å–20 Å and the thickness of said second material layers is in the range of 10 Å–100 Å.

7. The semiconductor quantized layered structure of any one of the claims 1 through 4 wherein the thickness of any of said layers is in the range of 5 Å–50 Å.

8. The semiconductor quantized layered structure of any one of the claims 1 through 4 wherein there is only a single layer of said first material and sandwiched between layers of said second material.

9. The semiconductor quantized layered structure of any one of the claims 1 through 4 wherein there are several layers of said first material alternating with the layers of said second material.

10. The semiconductor quantized layered structures of any one of the claims 1 through 4 wherein said layers are sandwiched by cladding layers having a wider bandgap than the bandgap of either of said first and second materials.

11. A semiconductor quantized layered structure comprising first and second different semiconductor materials comprising compound semiconductors from both the Group III and Group V elements and forming a plurality of alternate layers, each interfaced to its adjacent layer in a semiconductor heterojunction, the bottom of the conduction bands of said first and second materials being at different energy levels and the tops of the valence bands of said first and second materials being at different energy levels, the bottoms of said conduction bands of said first and second materials forming a plurality of serially arranged potential wells and barriers due to differences in the band structures of said different materials forming said alternate layers and the interfacing of said layers in said heterjunctions so that the thinness of said layers will spatially localize electrons to obtain quantized electron states in one dimension transverse to the longitudinal extent of said layers, characterized in that said first material is an indirect bandgap material, the layer or layers of said first and second materials being doped with an isoelectronic impurity to form isoelectronic centers that quantize electron states in three dimensions whereby electrons are localized in all directions relative to spatial regions of said formed wells.

12. The semiconductor quantized layered structure of claim 11 wherein said isoelectronic impurity is nitrogen.

13. The semiconductor quantized layered structure of claim 11 wherein said first material has optimized luminescence efficiency achieved by adjusting the thickness of said layers comprising said first material to be less than the mean free path of an electron in said first material in the absence of said second material.

14. The semiconductor quantized layered structure of claim 11 wherein only the layer or layers of said first material being doped with an isoelectronic impurity to form isoelectronic centers.

15. The semiconductor quantized layered structure of any one of the claims 11 through 14 wherein the thickness of said first material layers is in the range of 5 Å–20 Å and the thickness of said second material layers is in the range of 10 Å–100Å.

16. The semiconductor quantized layered structure of any one of the claims 11 through 14 wherein the thickness of said layers is in the range of 5 Å–50Å.

17. The semiconductor quantized layered structure of any one of the claims 11 through 14 wherein there is only a single layer of said first material and sandwiched between layers of said second material.

18. The semiconductor quantized layered structure of any one of the claims 11 through 14 wherein there are several layers of said first material alternating with the layers of said second material.

19. The semiconductor quantized layered structures of any one of the claims 11 through 14 wherein said layers are sandwiched by cladding layers having a wider bandgap than the bandgap of either of said first and second materials.

20. A semiconductor quantized layered structure for incorporation into a light emitting device comprising a central region of alternating thin congruent layers of indirect bandgap material, said indirect bandgap material composed of Group III and Group V elements, one group of said layers being doped with an impurity to form alternating layers to spatially localize carriers, said layers each having a thickness in the range of approximately 5 Å to 50 Å to provide quantum size effect to improve radiative recombination effects in said structure, said central region being bounded on one side by a material of a first conductivity type and being bounded on the other side by a material of a second conductivity type.

21. The semiconductor quantized layered structure of claim 20 wherein said first conductivity type contains an acceptor impurity and said second conductivity type contains a donor impurity.

22. The semiconductor quantized layered structure of claim 20 wherein said impurity is a donor impurity.

23. The semiconductor quantized layered structure of claim 22 wherein said donor is selected from the group consisting of Si, Se, Te, Sn, S or Ge.

24. The semiconductor quantized layered structure of claim 20 wherein said impurity is an acceptor impurity.

25. The semiconductor quantized layered structure of claim 24 wherein said acceptor impurity is selected from the group consisting of Zn, Cd, Mg, Be, Si or Ge.

26. The semiconductor quantized layered structure of claim 20 wherein said indirect bandgap material has optimized luminescence efficiency achieved by adjustng the thickness of said layers comprising said material to be less than the mean free path of an electron in said material.

27. The semiconductor quantized layered structure of claim 20 wherein said indirect bandgap material is an alloy composition with the compositional alloy adjusted to be near its bulk direct/indirect transition.

28. The semiconductor quantized layered structure of claim 20 wherein said central region is bounded by wider bandgap semiconductor cladding layers comprising said material of said first and second conductivity type.

29. A semiconductor quantized layered structure comprising a central region having one layer of indirect bandgap material with adjacent layers of wider bandgap compared to said layer, an isoelectronic impurity in said layer to provide isoelectronic traps therein to spatially localize carriers, said layer being sufficiently thin to a provide quantum size effect.

30. A semiconductor quantized layered structure comprising a central region having at least one layer of indirect bandgap material with adjacent layers of wider bandgap compared to said one layer, said one layer provided with an isoelectronic impurity to spatially localize carriers, said one layer being sufficiently thin to provide a quantum size effect, said central region being bounded on one side by a material of a first conductivity type and being bounded on the other side by a material of a second conductivity type to form a p-n junction across said region.

31. A semiconductor quantized layered structure comprising a central region of alternating thin congruent layers of indirect bandgap material, one group of said alternating layers being of a different bandgap than the other group of said layers to form alternating layers of narrow and wide indirect bandgap material, one of said groups of alternating layers also containing an isoelectronic impurity to spatially localize carriers, said layers being sufficiently thin, to provide quantum size effect to improve radiative recombination effects in said structure, said central region being bounded on one side by a material of a first conductivity type and being bounded on the other side by a material of a second conductivity type to form a p-n junction across said region.

32. The semiconductor quantized layered structure of claim 31 wherein all of said layers contain an isoelectronic impurity to spatially localize carriers.

33. A semiconductor quantized layered structure comprising a central region of alternating thin congruent layers of indirect bandgap material, one group of said alternating layers being doped with a shallow impurity, said one group of alternating layers also containing an isoelectronic impurity the combination of which spatially localize carriers, said layers being sufficiently thin, to provide a quantum size effect, said central region being bounded on one side by a material of a first conductivity type and being bounded on the other side by a material of a second conductivity type to form a p-n junction across said region.

34. The semiconductor quantized layered structure of claim 33 wherein said one group of said alternating layers being of a different bandgap than the other grop of said layers to form alternating layers of narrow and wide indirect bandgap material.

35. A semiconductor quantized layered structure comprising a central region of alternating thin congruent layers of indirect bandgap material, one group of said alternating layers being doped with a shallow impurity and a second group of second alternating layer provided with an isoelectronic impurity to spatially localize carriers, said layers being sufficiently thin, to provide a quantum size effect, said central region being bounded on one side by a material of a first conductivity type and being bounded on the other side by a material of a second conductivity type to form a p-n junction across said region.

36. The semiconductor quantized layered structure of claim 35 wherein said one group of said alternating layers being of a different bandgap than the other group of said layers to form alternating layers of narrow and wide indirect bandgap material.

37. A semiconductord quantized layered structure comprising a central region of alternating thin congruent layers of indirect bandgap material, one group of said alternating layers provided with an isoelectronic impurity, said layers being sufficiently thin to provide a quantum size effect, a first set of said congruent layers being doped with an impurity of a first conductivity type and a second set of said congruent layers adjacent to said first set being doped with an impurity of a second conductivity type to form a p-n junction in said central region.

38. The semiconductor quantized layered structure of claim 37 wherein said one group of said alternating layers being of a different bandgap than the other group of said layers to form alternating layers of narrow and wide indirect bandgap material.

39. A semiconductor quantized layered structure comprising a central region of alternating thin congruent layers of indirect bandgap material, said indirect bandgap material composed of Group III and Group V elements, one group of said layers provided with an isoelectronic impurity to spatially localize carriers, each of said layers being sufficiently thin to provide a quantum size effect.

* * * * *